United States Patent [19]
Haushalter

[11] Patent Number: 5,736,759
[45] Date of Patent: Apr. 7, 1998

[54] REDUCED FATIGUE FERROELECTRIC ELEMENT

[75] Inventor: Robert C. Haushalter, Little York, N.J.

[73] Assignee: NEC Research Institute, Inc., Princeton, N.J.

[21] Appl. No.: 685,643

[22] Filed: Jul. 24, 1996

[51] Int. Cl.$^6$ ............................ H01L 29/06; H01L 29/12; H01L 29/76

[52] U.S. Cl. .................. 257/295; 257/31; 257/43; 257/310; 365/43; 365/65; 365/145

[58] Field of Search .................. 257/43, 295, 310, 257/31; 365/43, 65, 145, 66

[56] References Cited

U.S. PATENT DOCUMENTS

| | | |
|---|---|---|
| 4,786,837 | 11/1988 | Kalnin et al. .................. 310/364 |
| 5,247,189 | 9/1993 | Tanaka et al. .................. 257/31 |
| 5,519,234 | 5/1996 | Paz de Araujo et al. .................. 257/295 |
| 5,578,867 | 11/1996 | Argos, Jr. et al. .................. 257/295 |

*Primary Examiner*—Valencia Martin Wallace
*Attorney, Agent, or Firm*—Jeffery J. Brosemer

[57] ABSTRACT

A fatigue resistent ferroelectric element having a ferroelectric body, and regions of enhanced oxide ion mobility on opposite sides of the body to which are attached electrodes. In one embodiment, an element made from the known ferroelectric material PZT is treated at each of two surfaces where the electrodes are to be attached with a fast ion conductor, such as doped yttria stabilized zirconia. In another embodiment, a ferroelectric element constructed essentially of strontium tantalite ($SrTaO_6$) has each of its surfaces where electrodes are to be attached treated with bismuth oxide ($Bi_2O_3$) that is then diffused into surface regions of the element during an annealing process.

11 Claims, 6 Drawing Sheets

$SrTa_2O_6 \cdot nBi_2O_3$ with $n$= relatively large $SrTa_2O_6 \cdot nBi_2O_3$ with $n$= relatively small pure $SrTa_2O_6$ Electrode Example: Intergrowths of $SrTa_2O_6 \cdot nBi_2O_3$ As Prepared After Annealing Example: Intergrowths of $SrTa_2O_6 \cdot nBi_2O_3$

REDUCED FATIGUE FERROELECTRIC ELEMENT

TECHNICAL FIELD

This invention relates generally to ferroelectric materials and devices and in particular to a ferroelectric element exhibiting reduced fatigue suitable for incorporation into a wide variety of ferroelectronic devices such as capacitors and memory cells.

DESCRIPTION OF THE ART AND PROBLEM

Ferroelectric materials are those materials which are capable of retaining a polarization state, once set in the polarization state by an applied electric field. More importantly, the ferroelectric material maintains that polarization state for a substantial period of time, even after the electric field is removed or until an electric field of opposite sign and sufficient magnitude is applied which reverses the state of the polarization. As such, ferroelectric materials have attracted considerable interest as building blocks for electronic storage devices such as capacitors and memories.

By way of background, if an electric field of sufficient strength is placed across a ferroelectric capacitor, a polarization in the direction of the electric field remains in the ferroelectric material within the capacitor, even when the electric field is removed. Subsequently, if an electric field of opposite sign is placed across the ferroelectric capacitor, a polarization opposite to the previous polarization remains within the ferroelectric capacitor when this latter field is removed. Consequently, useful electronic devices have been constructed wherein the remnant polarization in one direction is a logic "1" state, and remnant polarization in the opposite direction is a logic "0" state.

A variety of ferroelectric materials are known, and in particular perovskite oxides such as $PbZrO_3$ (PZT), $BaTiO_3$ and $SrTiO_3$ or ilmenite oxides such as $LiNbO_3$, have been well characterized. And while such ferroelectric materials are well known, their use in modern electronics, and particularly microelectronics has been limited. The reason for this limited use is that ferroelectric materials and devices constructed from such materials are typically plagued by a common problem, namely the frequent, rapid switching of the polarization of a ferroelectric material fatigues the ferroelectric material. Consequently, the ferroelectric material loses its ability to retain a polarization and therefore loses any utility as an electronic storage device.

Prior art attempt to overcome the fatigue associated with ferroelectric materials have met with limited success. In particular, in International Patent Application Number PCT/US92/10627 entitled "Layered Superlattice Material Applications", the applicants describe an integrated circuit having a layered superlattice material as a ferroelectric element. Specifically, and with reference to FIG. 1, the applicants there teach materials having a number of distinct layers within a unit cell of a given material, alternating layers of rigid ferroelectric and a less rigid, non-ferroelectric. A characteristic of such layered materials, and as can be readily observed with reference to FIG. 1, is that the layers are well-defined and uniform in composition with respect to the elements present throughout the layer. Consequently, if one were to plot composition vs. depth for the crystals and devices constructed therefrom in accordance with these prior art teachings, the plot would resemble that shown in FIG. 2. As a result of the layering, the prior art teaches that the layered superlattice material provides a "shock absorber" effect which prevents the degradation of the ferroelectric.

Despite initial optimism and promise for such structures, however, this prior art layered superlattice ferroelectric suffers from the need for complex preparation and processing. Consequently, the need remains in the art for ferroelectric elements which are practical to prepare and are not disabled by fatigue.

SUMMARY OF THE INVENTION

The above problem is solved and an advance is made over the art in accordance with the teachings of the present invention wherein a ferroelectric element is made fatigue resistant. In particular, the invention involves the introduction of an additive, whose concentration varies as a function of depth from a surface of the ferroelectric element, which enhances the mobility of oxide ions in the ferroelectric element at one or more surfaces of the ferroelectric element where electrodes are to be attached. As a result of the introduction of the additive and its concentration variation, the structure and/or composition of the ferroelectric element varies as a function of depth as well.

In one embodiment, an element made from the known ferroelectric material PZT is treated at each of two surfaces where the electrodes are to be attached with a fast ion conductor, such as doped yttria stabilized zirconia.

In another embodiment, a ferroelectric element constructed essentially of strontium tantalate ($SrTa_2O_6$) has each of its surfaces where electrodes are to be attached treated with bismuth oxide ($Bi_2O_3$) that is then diffused into surface regions of the element during an annealing process.

Further features and advantages of the present invention, as well as the structure and operation of various embodiments of the present invention are described in detail below with reference to the accompanying drawings.

BRIEF DESCRIPTION OF THE DRAWING

The teachings of the present invention can be readily understood by considering the following detailed description in conjunction with the accompanying drawings, in which.

DETAILED DESCRIPTION

A preferred embodiment of the invention will now be described while referring to the figures, several of which may be simultaneously referred to during the course of the following description.

Figure 1:
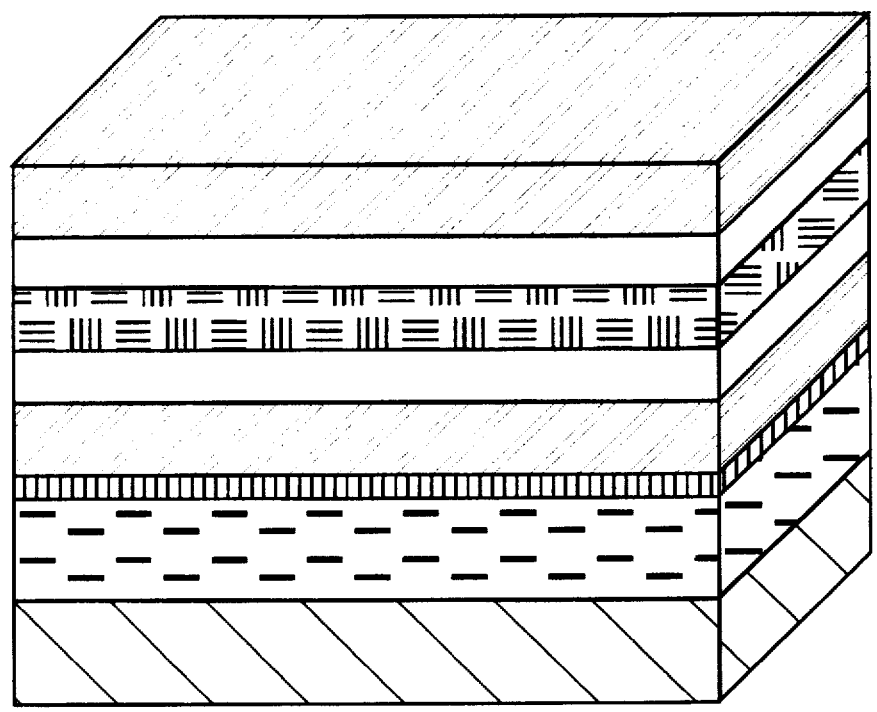
FIG. 1 is a cross-sectional schematic of a prior-art, layered, fatigue resistant ferroelectric.
Figure 2:
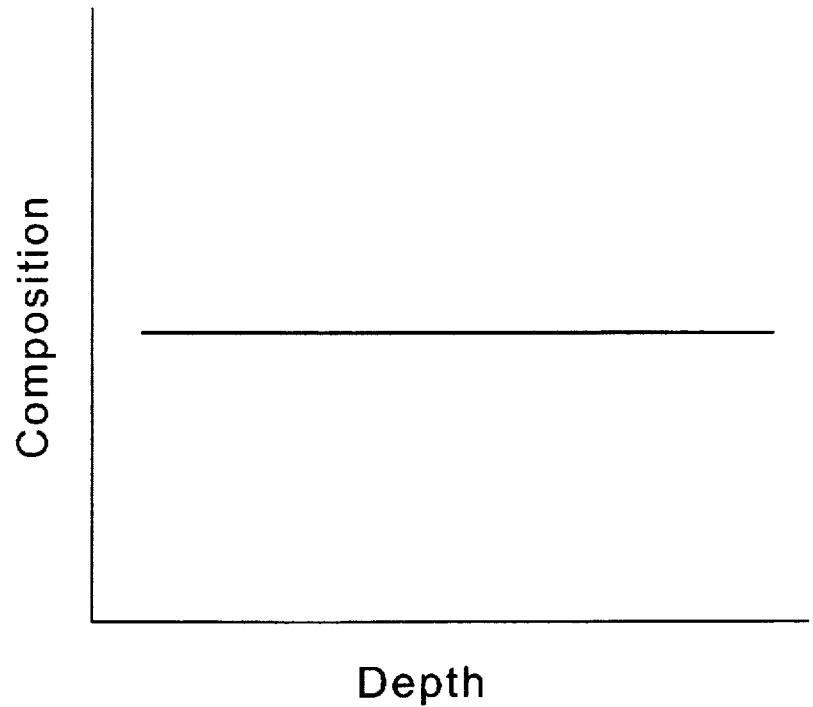
FIG. 2 is a plot showing composition vs. depth for the prior art device of FIG. 1.
Figure 3:
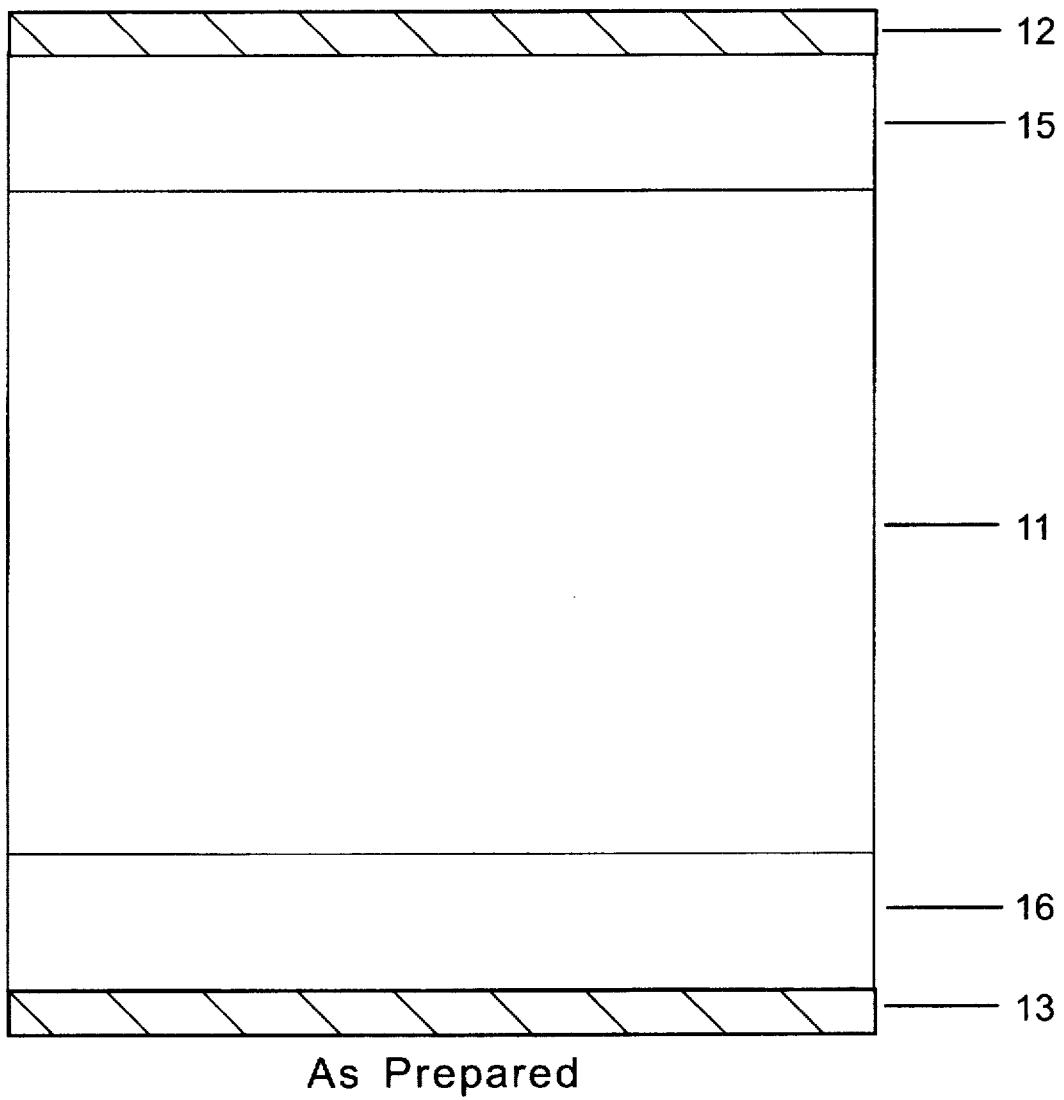
FIG. 3 is a cross-section of a ferroelectric element after initial construction according to the teachings of the present invention.

With reference now to FIG. 3, ferroelectric element 10 includes a body 11 of a ferroelectric material having opposite surfaces to which are attached electrodes 12 and 13. Typically the body of such a ferroelectric element may have dimensions of 100 mil by 100 mil and a thickness of about 10 mils.

Figure 4:
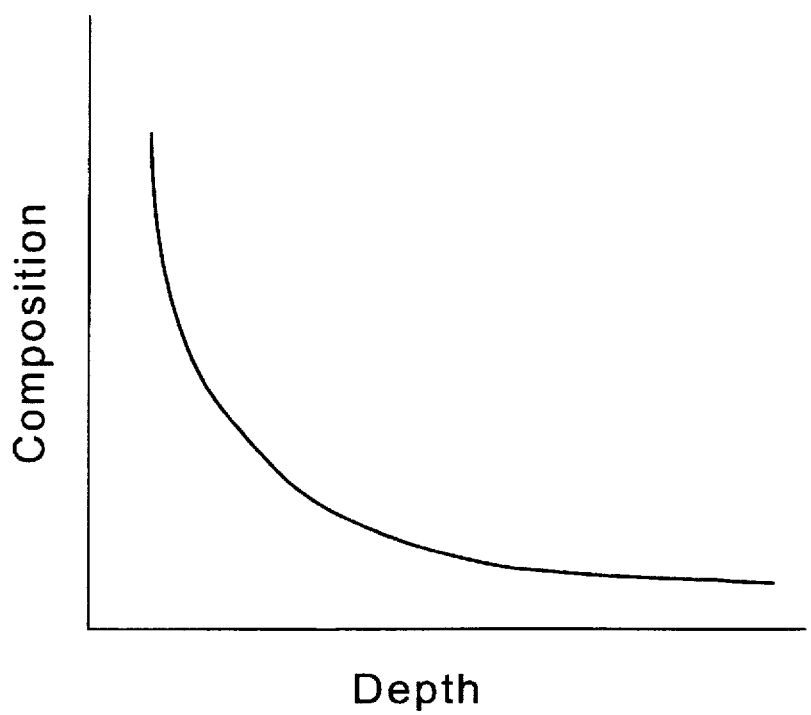
FIG. 4 is a plot showing composition vs. depth for a device constructed according to the teachings of the present invention.

The composition of the body may be substantially a perovskite type oxide such as PZT, BaTiO$_3$ or ilmenite type oxide, such as lithium niobate, LiNbO$_3$ which are all frequently described by the general formula, ABO$_3$. Alternative materials are shown in Table 1. Moreover, as a feature of the present invention, the surface regions 15 and 16 underlying the electrodes 12 and 13 respectfully, include a concentration of an oxide ion conductor diffused into the ferroelectric material 11 which effectively enhances oxide ion mobility in the ferroelectric element. Of particular significance is the fact that the oxide ion conductor is not fabricated as a well-defined layer. Rather, the oxide ion conductor exists in a gradient concentration, that is, the concentration is greatest near the electrodes and decreases closer to the ferroelectric material. A plot of composition vs. depth for the oxide-ion conductor in crystals and devices constructed therefrom in accordance with the present invention is shown in FIG. 4.

Figure 5:
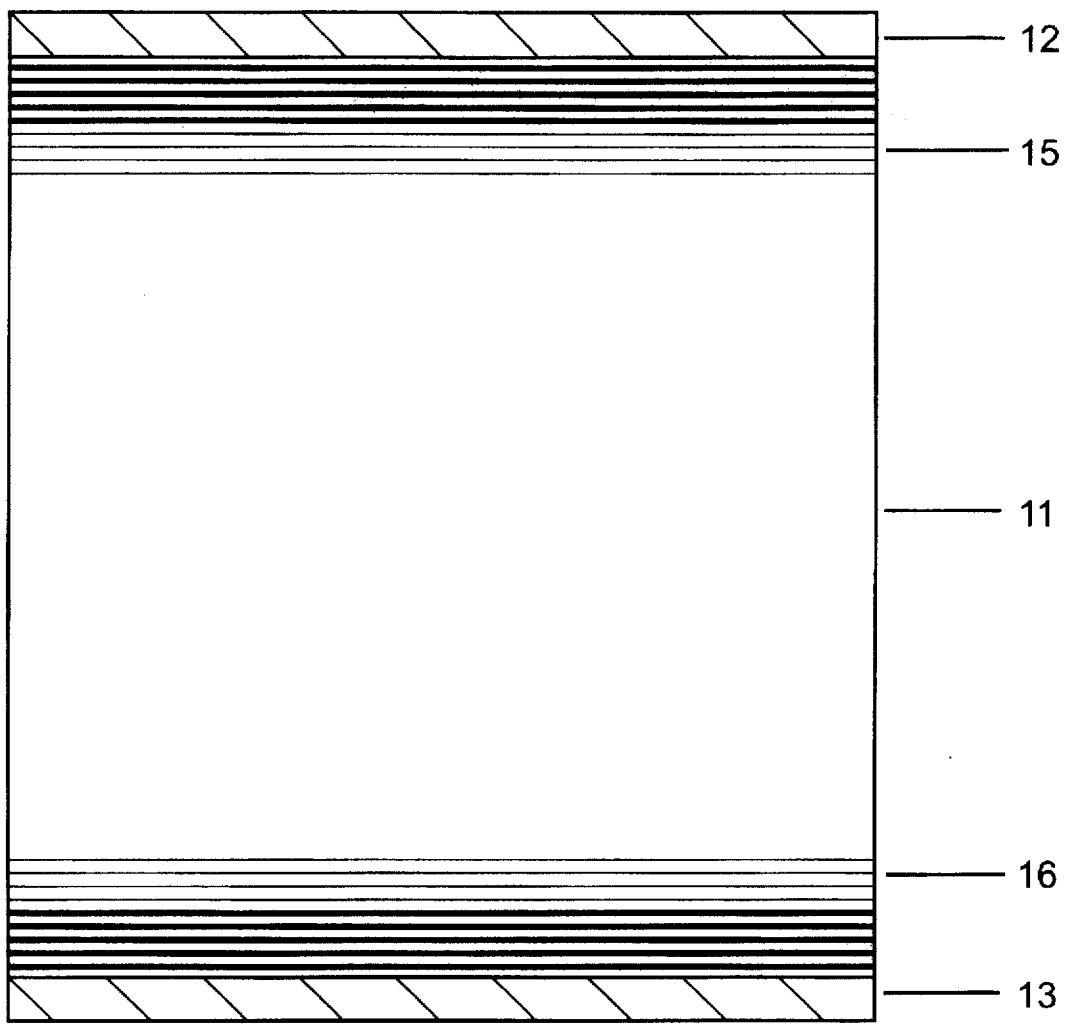
FIG. 5 is a cross-section of the ferroelectric element of FIG. 3 after annealing.

Preparation of the ferroelectric element is straightforward and readily understood by those skilled in the art. Specifically, and with simultaneous reference to FIGS. 3 and 5, the ferroelectric material 11 has applied to its opposite surfaces an oxide ion conductor material such as Y$_2$O$_3$/ZrO$_2$ or Bi$_2$O$_3$. Electrodes 12 and 13 are subsequently applied to the oxide ion conductor material and the entire element undergoes treatment by annealing, which results in the production of diffused, gradient regions 15, 16 having enhanced oxide mobility. Those skilled in the art can readily appreciate that the dimensions of regions 15 and 16 may be desirably modified through appropriate annealing conditions and initial amount of oxide overlayer. FIG. 5 is a cross sectional view of a device constructed according to the teachings of the present invention after annealing.

Figure 6:
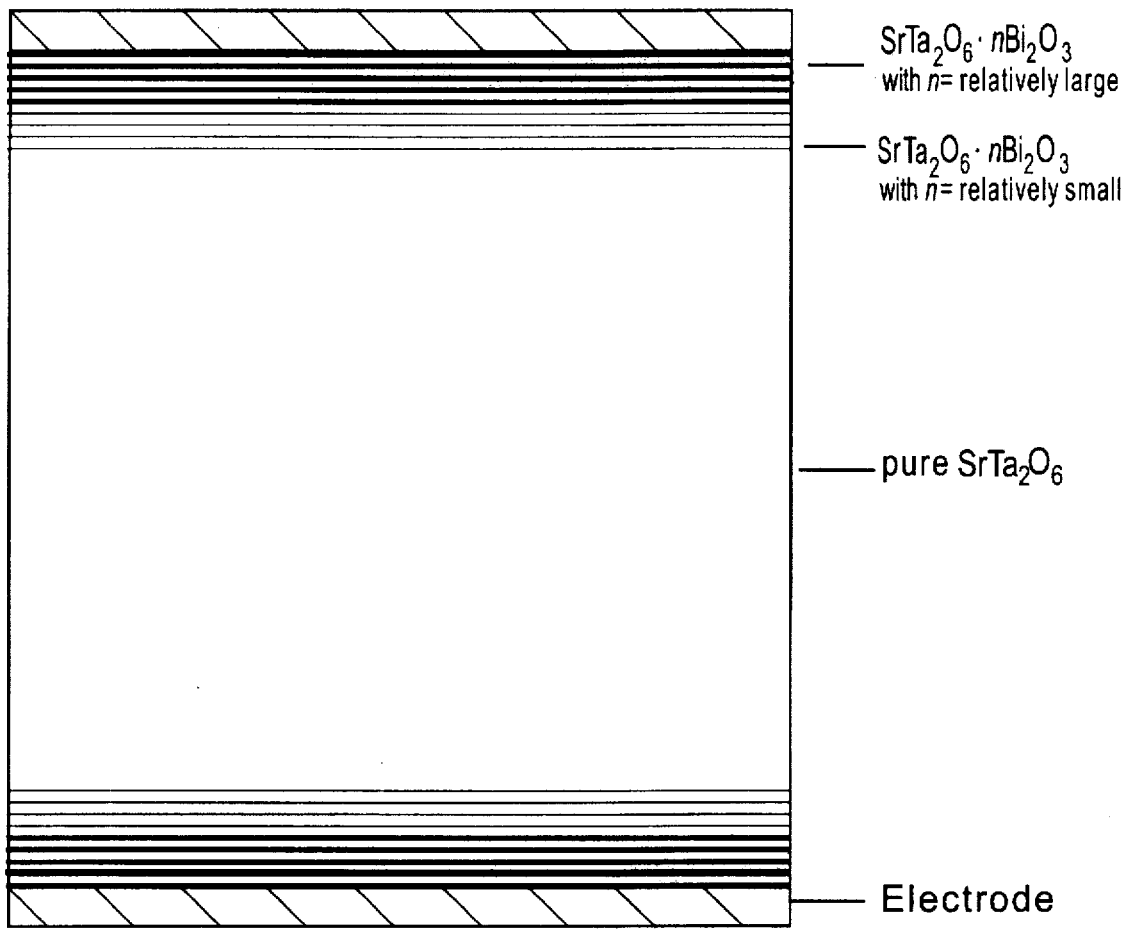
FIG. 6 is a cross-sectional view of an exemplary ferroelectric element constructed according to the teachings of the present invention.

Finally, and with reference to FIG. 6, there it shows a cross sectional view of an exemplary ferroelectric element constructed according to the present teachings. Specifically, the compositional variation of the number of ion conducting intergrowths as a function of depth are shown for SrTa$_2$O$_6$·nBi$_2$O$_3$. As can be readily observed with reference to this figure, the concentration of Bi$_2$O$_3$ is a maximum in those regions of the element closest to the electrodes and a minimum in those regions closest to the pure ferroelectric, in this case SrTa$_2$O$_6$.

TABLE 1

| Name | Formula |
| --- | --- |
| A. Perovskite-type Compounds | |
| Barium titanate | BaTiO$_3$ |
| Lead titanate | PbTiO$_3$ |
| Strontium titanate | SrTiO$_3$ |
| Cadmium titanate | CdTiO$_3$ |
| Sodium niobate | NaNbO$_3$ |
| Potassium niobate | KNbO$_3$ |
| Sodium tantalate | NaTaO$_3$ |
| Potassium tantalate | KTaO$_3$ |
| Bismuth ferrite | BiFeO$_3$ |
| Potassium iodate | KIO$_3$ |
| Caesium germanium chloride | CsGeCl$_3$ |
| Silver niobate | AgNbO$_3$ |
| Silver tantalate | AgTaO$_3$ |
| B. Lithium-niobate-type compounds | |
| Lithum niobate | LiNbO$_3$ |
| C. Tungsten-bronze-type Oxides | |
| Lead (meta) niobate | PbNb$_2$O$_6$ |
| Lead (meta) tantalate | PbTa$_2$O$_6$ |
| D. Pyrochlore-type Compounds | |
| Cadmium(pyro)niobate | Cd$_2$Nb$_2$O$_7$ |
| Cadmium niobium oxysulphide | Cd$_2$Nb$_2$O$_6$S |
| Cadmium chromium niobate | Cd$_2$CrNbO$_6$ |

TABLE 1-continued

| Name | Formula |
| --- | --- |
| E. Layer-structure oxides | |
| Strontium bismuth tantalate | SrBi$_2$Ta$_2$O$_9$ |
| Bismuth titanate | Bi$_4$Ti$_3$O$_{12}$ |
| F. Barium-fluoride-type compounds | |
| Barium lithium aluminum oxyfluoride | BaLi$_{2x}$Al$_{2-2x}$F$_{4x}$O$_{4-4x}$ |
| Barium magnesium fluoride | BaMgF$_4$ |
| G. Molybdates | |
| Samarium molybdate | Sm$_2$(MoO$_4$)$_3$ |
| Bismuth titanate | Bi$_4$Ti$_3$O$_{12}$ |
| H. PZT Compounds | Pb(Zr$_x$Ti$_{1-x}$)O$_3$ |
| I. Miscellaneous Oxides | |
| Rubidium tantalate | RbTaO$_3$ |
| Lead germanate | Pb$_5$Ge$_3$O$_{11}$ |
| J. Manganites | |

The above description is considered to be only an illustrative embodiment of the invention. It is to be understood that various and numerous other arrangements may be devised by one skilled in the art without departing from the scope of the invention. The invention is thus limited only as defined by in the accompanying claims.

What is claimed is:

1. A ferroelectric device comprising a ferroelectric element having a pair of opposed surfaces and a pair of electrodes on said opposed surfaces wherein regions of the ferroelectric element that are adjacent to the electrodes are rich in doped Y$_2$O$_3$/ZrO$_2$, such that the mobility of oxide ions in the ferroelectric element is enhanced.

2. A ferroelectric device comprising a ferroelectric element having a pair of opposed surfaces and a pair of electrodes on said opposed surfaces wherein regions of the ferroelectric element that are adjacent to the electrodes are rich in doped Y$_2$O$_3$/ZrO$_2$ such that the mobility of oxide ions in the ferroelectric element is enhanced and in which the ferroelectric element is essentially one selected from the Perovskite-type compounds consisting of: Barium titanate, Lead titanate, Strontium titanate, Cadmium titanate, Sodium niobate, Potassium niobate, Sodium tantalate, Bismuth ferrite, Potassium iodate, Caesium germanium chloride, Silver niobate, Silver tantalate.

3. A ferroelectric device comprising a ferroelectric element having a pair of opposed surfaces and a pair of electrodes on said opposed surfaces wherein regions of the ferroelectric element that are adjacent to the electrodes are rich in doped Y$_2$O$_3$/ZrO$_2$ such that the mobility of oxide ions in the ferroelectric element is enhanced and in which the ferroelectric element is essentially PZT.

4. A ferroelectric device in accordance with claim 1 in which the ferroelectric element is essentially one selected from the Lithum-niobate-type compounds.

5. A ferroelectric device in accordance with claim 1 in which the ferroelectric element is essentially one selected from the Tungsten-bronze-type oxides.

6. A ferroelectric device in accordance with claim 1 in which the ferroelectric element is essentially one selected from the Pyrochlore-type compounds.

7. A ferroelectric device in accordance with claim 1 in which the ferroelectric element is essentially one selected from the layer-structure oxides.

8. A ferroelectric device in accordance with claim 1 in which the ferroelectric element is essentially one selected from the barium-fluoride-type compounds.

9. A ferroelectric device in accordance with claim 1 in which the ferroelectric element is essentially a manganite compound.

10. A method of manufacturing a ferroelectric device comprising the steps of:

forming, in a ferroelectric element having opposite surfaces, regions rich in doped $Y_2O_3/ZrO_2$, that enhances the mobility of oxide ions in the ferroelectric element wherein said regions are formed adjacent to said opposite surfaces;

attaching electrodes to each of said regions; and treating said device such that said regions are interdiffused with said ferroelectric element.

11. The method according to claim 10 wherein said treating step includes annealing said ferroelectric device.

* * * * *